PRINTED CIRCUIT MODULE AND PROCESS FOR MAKING THE MODULE

Filed Nov. 26, 1968 2 Sheets-Sheet 1

INVENTOR.
WALTER E. J. SPALL

BY Charles M. Hogan
Eugene C. Goodale
ATTORNEYS

PRINTED CIRCUIT MODULE AND PROCESS FOR MAKING THE MODULE

Filed Nov. 26, 1968

2 Sheets-Sheet 2

INVENTOR.
WALTER E. J. SPALL

BY

Charles M. Hogan
Eugene C. Goodale

ATTORNEYS

United States Patent Office 3,532,802

Patented Oct. 6, 1970

3,532,802

PRINTED CIRCUIT MODULE AND PROCESS FOR MAKING THE MODULE

Walter E. J. Spall, Cincinnati, Ohio, assignor to Avco Corporation, Cincinnati, Ohio, a corporation of Delaware Filed Nov. 26, 1968, Ser. No. 779,131
Int. Cl. H05k 1/04, 3/30
U.S. Cl. 174—68.5 5 Claims

ABSTRACT OF THE DISCLOSURE

A printed circuit module and method of manufacturing the module is disclosed in which a metallic sheet is formed to a base uniform grid pattern and the basic grid is bonded to a base substrate. Discrete areas of the grid pattern are then removed to produce a predetermined circuit pattern. A punching operation produces a lifted tab and hole through the substrate which permits the insertion of a component lead therethrough for connection to the tab.

BACKGROUND OF THE INVENTION

The present invention relates to electronic circuitry and more particularly to an electronic printed circuit board or module having universal application.

Many processes have been used at one time or another to produce printed circuit boards. In spite of this apparent diversity, only a few are employed to any great extent. These processes are divided into chemical and mechanical processes for making the boards. The mechanical processes are generally used for making specialized type circuit boards.

The chemical processes have been most widely used in this field and in the past, the etched foil process has been the most widely used method for the production of printed circuitry. It is a subtractive process by which the excess metal is selectively removed to leave the desired conductor configuration. In general, a copper—or other metallic-foil-clad laminate—is first coated in the desired conductor configuration with a protective resist material. The copper not protected by the resist is then chemically removed by an etchant. Following etching the printed wire board is washed to remove etching residues and then dried. Removal of the resist is usually accomplished by vapor degreasing or by immersion in a solvent.

It has been found that the etched copper foil process does not produce an economical circuit board for use in welded construction electronic module assembly. The most general procedure is to start with a copper base upon which a nickel surface is deposited since nickel can be readily welded. The desired circuitry is then prepared on the nickel surface after which the copper is removed, leaving the nickel circuit. This process requires a great amount of time and has the inherent problem of maintaining the proper thickness of the nickel deposition. The nickel circuitry is then bonded generally to a glass epoxy substrate. This presents a further problem because nickel does not bond easily to the glass epoxy substrate. Even the best bonding techniques to date still leave the circuit module far inferior to that of a copper-epoxy laminated circuit board. However, a nickel circuit is desired since the leads on electrical components are nickel and it is possible to obtain a better joint between nickel and nickel by welding, than by trying to join the nickel lead with a non-nickel material.

An object of this invention is to provide an electronic circuit module which is more economical to produce than previous circuit boards, yet which eliminates the problems inherent in the bonding of a nickel circuit to a glass epoxy substrate.

A further object is to provide a circuit board having a pull strength that far exceeds the pull strength of a copper-epoxy circuit board.

Another object of this invention is to provide a circuit board having the desired internal strength yet can be flexed and the circuit will not pull out of the base substrate.

Other objects and advantages of the present invention will be apparent to those skilled in the printed circuit art.

SUMMARY OF THE INVENTION

The present invention provides a printed circuit module having a universal grid pattern comprising a matrix of uniformly spaced holes. An integral part of each pattern is a built-in tab that extends into the center of the hole area. A module is formed by embedding the grid pattern in a base substrate so that the substrate flows around a portion of the grid pattern to provide a very strong bond which prevents the grid pattern from being pulled out of the substrate in normal use. A predetermined circuit pattern is formed in the module by removing discrete areas of the grid pattern in such a way that extended tabs may be electrically connected. Electrical component connecting tabs are formed in the circuit pattern by a punching operation which bends predetermined tabs away from the module surface and also scraps the substrate away from the tab to provide a clean surface to be joined to the component lead.

DESCRIPTION OF THE DRAWINGS

The manner in which the circuit module of the present invention is prepared is hereinafter described in connection with the drawings attached to and forming a part of the present specification and illustrating the methods of manufacturing the novel printed circuit board utilized in the preferred practice of the present teaching in which.

DETAILED DESCRIPTION OF THE INVENTION

Figure 1:
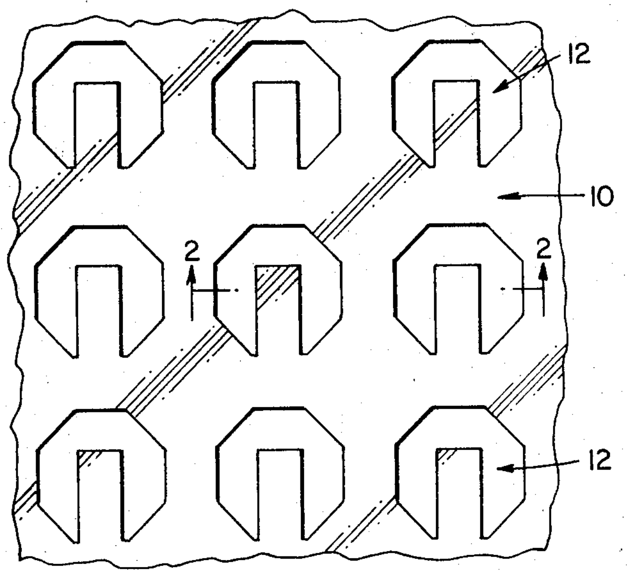
FIG. 1 is a diagrammatic top plan view of the grid pattern formed in the performance of this invention.

In the performance of this invention, an entire sheet of electroformed nickel 10 is reduced to a uniform grid pattern through known photochemical processes which depend on the selective hardening of a polymer by the chemical action of light. The first steps in this process is to apply a thin layer of a photosensitive resist solution on the nickel sheet 10 which is then dried. The resist is then exposed to light through a (usually) photographically produced negative pattern, such as with a step and repeat camera, producing the uniform pattern shown in FIG. 1. The universal pattern shown in FIG. 1 is made up of a matrix of octagonal holes 12 which have a cantilever type element or tab extending into the hole area. The tab is an integral part of the nickel sheet 10.

Figure 2:
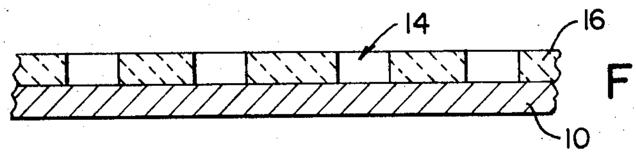
FIGS. 2–5, inclusive are greatly enlarged diagrammatic cross-sectional views along line 2—2 of FIG. 1 of an electronic circuit module according to the present invention, showing the successive steps by which it is manufactured.

Those portions of the resist struck by light are rendered insoluble in a solvent, or solvent mixture, in which the unexposed resist is soluble or extensively softened. Unexposed resist areas 14 are selectively dissolved or washed away, leaving a desired resist protective pattern 16 on the nickel surface as shown in FIG. 2.

Figure 3:
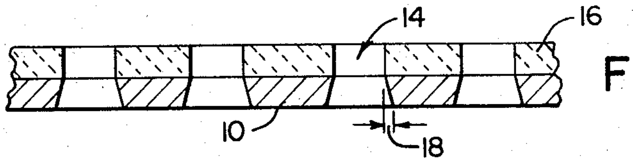

The next step in the process is to subject the photoresist covered nickel sheet to any suitable etchant so that any nickel not covered by the photoresist material, i.e., the octagonal holes 12, will be dissolved by the etchant. In this step, it is important that the etchant only be applied from the side having the photoresist thereon because the etching process will tend to produce a slight undercut 18 in the nickel as shown in FIG. 3. This undercut is highly desirable in this process for purposes which will be described hereunder.

After the etching step, the nickel sheet 10 is cleaned and all of the photoresist material is removed leaving only a single sheet of nickel having a plurality of octagonal holes etched therethrough.

Figure 4:
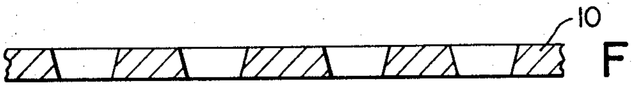
Figure 5:
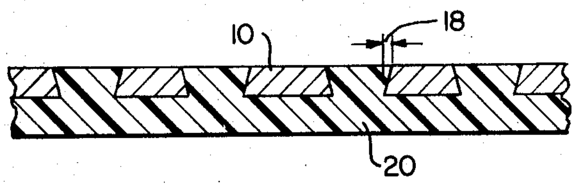

A high structural bond between the nickel pattern 10 and a glass epoxy substrate is obtained by inverting the nickel pattern 10 as seen in FIG. 4, before embedding the nickel pattern 10 in the substrate. The etched nickel pattern 10 is laid between platens with the widest face of the undercut facing the desired base substrate. The platens are then placed in a conventional laminating press with heated platens, temperature and pressure used being dependent on the base substrate. Typical temperatures and pressure used for glass epoxy are 10 lbs. per square inch for 240 seconds followed by 30 minutes at 250 lbs. per square inch, all at a temperature of 350° F. The platens holding the circuit module are then cooled for 7 minutes to 100° F. This step results in the nickel sheet 10 being embedded in the glass epoxy substrate 20 as shown in FIG. 5. It is seen that the glass epoxy 20 flows over the inverted undercut edges and forms a flush upper surface between the epoxy and the metal sheet.

The strength of the bond obtained between the base substrate 20 and the nickel pattern 10 is very high and readings consistently achieved of 1.75 lbs. per .030 inch width of lift tab have been recorded. This strength is obtained by using the etching undercut to form a bond with the epoxy that resembles a dado joint.

A second nickel removing step is needed in order to form the predetermined or desired circuit pattern from the uniform grid pattern which consists of the inverted nickel sheet 10 in which the substrate 20 has flowed upward into the formed holes 12 of the nickel. The nickel pattern, at this point, is all electrically connected. The desired circuit pattern is formed by removing discrete areas of the nickel sheet, such as by etching. The removal of the discrete areas of nickel, in effect, performs a blocking function in the grid pattern. As an example, in FIG. 6, nickel areas 30–35, inclusive, have been removed to maintain the electrical connection between tabs 22 and 28 and also to effectively block tabs 22 and 28 from the rest of the nickel sheet or circuitry. It is also seen that, in this example, tabs 23 and 25 are electrically connected. The discrete areas of nickel are removed or etched away down to the base substrate. It is obvious that any shape hole could be utilized in this circuit module, however, it has been found that the octagonal shaped holes used in this embodiment of the invention, provide for unlimited variety of paths or conductor patterns.

Figure 7:
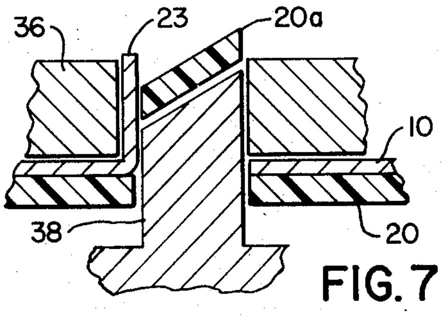
FIG. 7 is a diagrammatic cross-sectional view along line 7—7 of FIG. 6 showing the component connecting tab forming operation.
Figure 6:
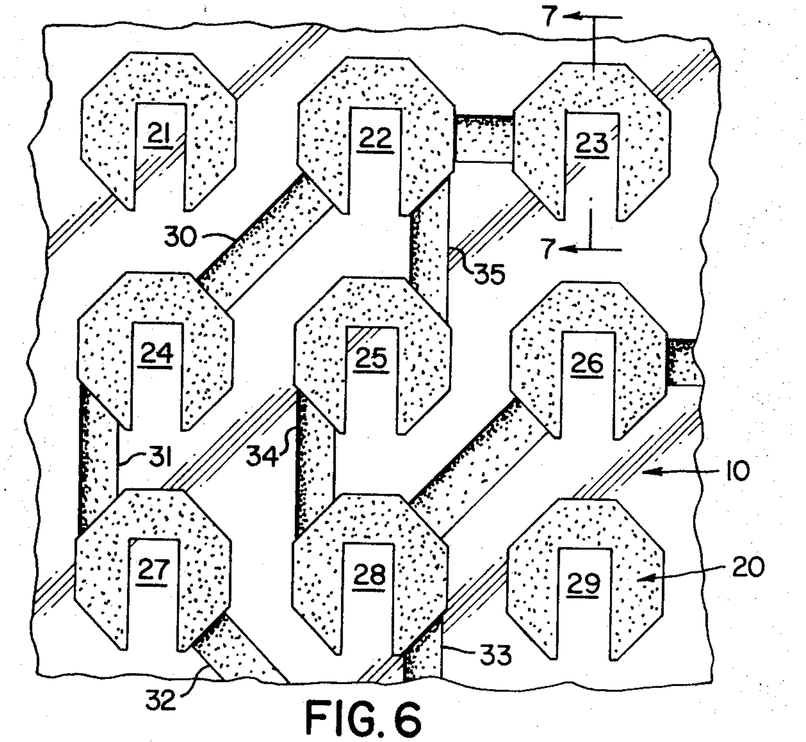
FIG. 6 is a diagrammatic top plan view showing the formation of a representative circuit pattern formed by this invention.

The patterned circuit module, as shown in FIG. 6, is then positioned in a specially prepared die 36 where holes through the substrate for inserting the component leads into the circuit module are formed. As seen in FIG. 7, the punch 38, having an inclined upper edge, first pierces the epoxy substrate 20. Continued relative movement between the punch 38 and the die 36 causes the nickel tab 23 to be bent upward and away from the flush surface of the module at a 90° angle. The punch 38 also scrapes the epoxy substrate **20*a* from the undersurface of the nickel tab 23** to produce a clean connecting surface. It can be seen that the punched hole in the base substrate is of a rectangular shape, essentially similar to the shape of the lifted tab. The shape and size of the punched hole are advantageous in that a number of different size component leads may be inserted for connection to the uplifted tabs.

Figure 8:
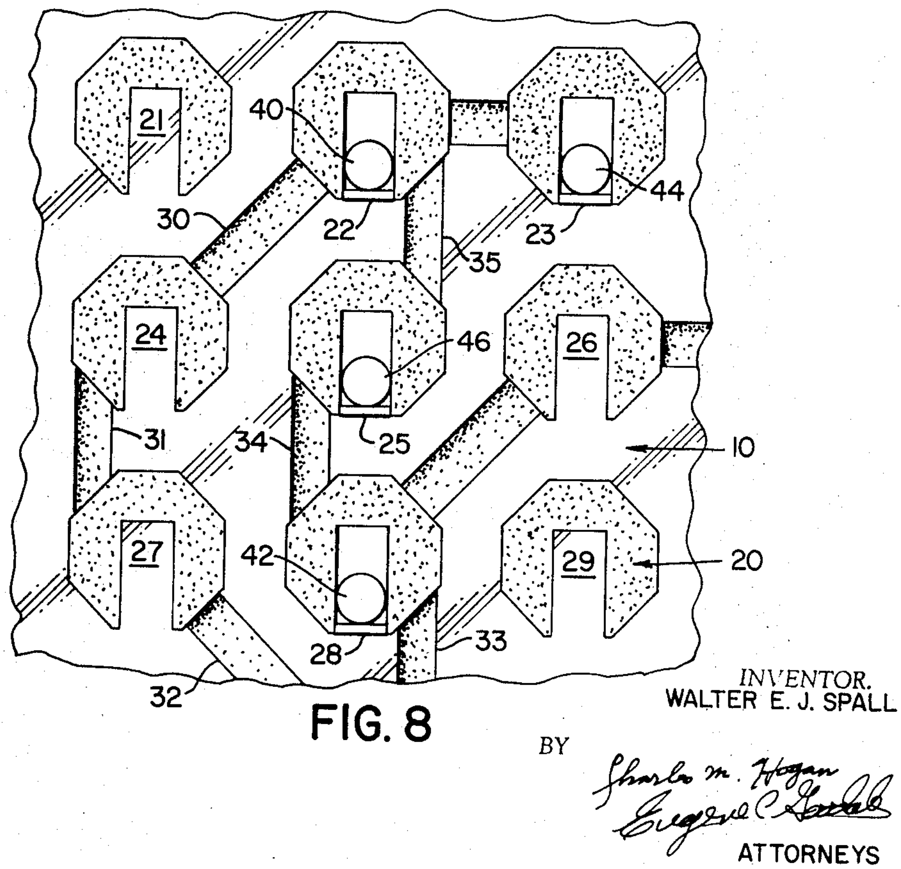
FIG. 8 is a diagrammatic top plan view of the circuit board in accordance with this invention with component leads attached.

FIG. 8 shows a representative completed circuit module in which component leads 40 and 42 are electrically connected and isolated from the remainder of the circuit. Component leads 44 and 46 are also electrically connected and isolated. Each component lead is joined to its respective uplifted tab by any conventional means. In the instant case, welding is preferred because the tab is nickel and the component lead is nickel and a nickel to nickel weld provides a perfect joint.

It is seen that by using the process of the present invention, interconnections between tabs are predetermined and provided and the connections between the various leads and circuit tabs may be welded or soldered at junction points which are completely exposed and accessible. Thus, each connection may be reached individually for inspection, circuit testing, or repair. The use of the universal type grid pattern also lends itself for use in an automated procedure for component connections. It is seen that an automated welding mechanism could be programmed very easily by utilizing the X and Y coordinates of the extended tabs in a known manner.

From the foregoing it will be apparent to those skilled in the electronic arts that the present disclosure provides features of advantage over prior circuit practices in several respects. Of primary importance is the fact that the present invention provides a much simpler and more practical operation than heretofore known to produce complex electronic circuit modules wherein all of the electrical junctions are welded, rather than soldered. The welded junction is not only better electrically, but is capable of withstanding much greater impact, vibration, or other physical abuses, particularly at elevated temperatures.

The applicant's approach to the utilization of welded circuitry departs rather sharply from prior known practices in that it utilizes circuit modules designed so that each module has only one separate perforation for each terminal lead from the component.

The present concept also makes for extreme compactness of circuitry in relation to the actual sizes of the electronic components involved, and thus lends itself to applications requiring high component density coupled with rugged structure and reliable performance. Experiments have been conducted on .002 inch thru .007 inch thick nickel foil using circuit line widths from .010 inch thru .025 inch. Tab widths have been maintained within limits of .020 inch to .030 inch. The results have been consistent and all results proved this invention to be a functional and reliable method for preparing electronic circuit modules. Circuits according to the present disclosure are ideally suited to use with any of the newer types of sub-miniature components, circuit wafer stacks or solid state devices, and are thus capable of meeting the most exacting space limitations, yet they are equally suited to the construction of circuitry of sufficiently high component density to meet most practical requirements, even utilizing conventional types and sizes of components.

The circuitry is also suited a wide range of possible applications by reason of the fact that the junctions may be connected either by welding or soldering, as desired, or by any combination of the two techniques. In cases in which soldering is deemed preferable, the junctions may project from the circuit boards enough so that they may be soldered by resistance heating, if desired, or dipped in solder without flowing the molten metal over the surfaces of the circuit board. The exposed position of the junctions also facilitate welding, and adapts the circuitry to extremely high temperature applications.

It is thus seen that the objectives of this invention have been accomplished. A circuit module has been manufactured by a process much simpler than heretofore known. The module has high pull strength because of the dado type joint formed between the undercut nickel edges and the base substrate.

While the steps and the form of apparatus herein decribed constitute preferred embodiments of the invention, it is to be understood that the invention is not limited to these precise forms.

What is claimed is:

1. The method of manufacturing nickel printed circuit modules comprising the steps of:
forming a uniform grid pattern of elements in a sheet of nickel by photochemical methods, each separate element comprising an integral tab projecting into an aperture,
etching the nickel sheet from the photochemically treated side wherein an undercut is produced around all etched edges of the apertures,
inverting the etched nickel sheet,
embedding the etched nickel sheet in a glass-epoxy base so that the epoxy flows over the inverted undercut edges to rigidly secure the nickel sheet in the base, thereby forming a circuit module having a flush upper metallic pattern and epoxy top surface and an epoxy bottom surface,
etching away discrete areas of the grid pattern to provide a predetermined circuit pattern,
positioning the circuit module in a punch assembly so that the punch will engage the epoxy bottom surface first,
and urging the punch through the circuit module wherein the punch first pierces the epoxy base, then bends integral tab portions of the circuit pattern outwardly from the flush surface to form component connecting tabs, and removes the epoxy base from the tab to produce a clean tab connecting surface.

2. A printed circuit module comprising:
an electroformed nickel sheet having a plurality of holes etched therethrough to provide a uniform grid pattern, said sheet having individual integral tabs extending into the holes,
said holes having an undercut etched around all edges,
a base substrate in which said grid pattern is embedded in inverted position so that the substrate flows over the widest face of the undercut and through each of the holes to form a flush surface with the upper surface of the grid pattern wherein said sheet is rigidly secured in the substrate,
and a circuit pattern formed by removing discrete areas of said grid pattern between the holes in a predetermined manner to effectively connect respective tabs and isolate respective tabs in a desired circuit configuration.

3. A printed circuit module comprising, in combination:
a substrate,
a sheet of a metal not readily bondable to a substrate and formed with a plurality of apertures therein, said apertures being arranged to form a uniform grid pattern, said sheet having an integral connecting tab projecting into each of said apertures, said sheet being embedded in said substrate and said apertures being defined by beveled edge surfaces which dovetail interlock with said substrate, the electrical continuity of said sheet being broken by predetermined areas of cut away metal formed to isolate various groups of electrically interconnected tabs from each other.

4. A printed circuit module in accordance with claim 3 in which desired tabs project upwardly from said metallic sheet forming component connecting tabs.

5. The method of manufacturing nickel printed circuit modules comprising the steps of:
forming a uniform grid pattern of elements in a sheet of nickel by photochemical methods, each separate element comprising an integral tab projecting into an aperture,
etching the nickel sheet from the photochemically treated side wherein an undercut is produced around all etched edges of the apertures,
inverting the etched nickel sheet,
embedding the etched nickel sheet in a glass-epoxy base so that the epoxy flows over the inverted undercut edges to rigidly secure the nickel sheet in the base, thereby forming a circuit module having a flush upper metallic pattern and epoxy top surface and an epoxy bottom surface, and
etching away discrete areas of the grid pattern to provide a predetermined circuit pattern.

References Cited

UNITED STATES PATENTS

| | | | |
|---|---|---|---|
| 2,734,150 | 2/1956 | Beck | 174—68.5 |
| 3,072,734 | 1/1963 | Fox et al. | 174—68.5 |
| 3,375,576 | 4/1968 | Klein et al. | 29—626 |

DARRELL L. CLAY, Primary Examiner

U.S. Cl. X.R.

29—625; 156—3; 317—101